(12) United States Patent
Herkel et al.

(10) Patent No.: US 11,565,911 B2
(45) Date of Patent: Jan. 31, 2023

(54) ELECTRONIC TEST NODES FOR AUTOMATIC CHECK OF A SAFETY CHAIN

(71) Applicant: Otis Elevator Company, Farmington, CT (US)

(72) Inventors: Peter Herkel, Berlin (DE); Norbert Diwisch, Berlin (DE)

(73) Assignee: OTIS ELEVATOR COMPANY, Farmington, CT (US)

( * ) Notice: Subject to any disclaimer, the term of this patent is extended or adjusted under 35 U.S.C. 154(b) by 55 days.

(21) Appl. No.: 16/953,475

(22) Filed: Nov. 20, 2020

(65) Prior Publication Data
US 2021/0155455 A1 May 27, 2021

(30) Foreign Application Priority Data
Nov. 25, 2019 (EP) ..................................... 19211342

(51) Int. Cl.
*G01R 31/327* (2006.01)
*B66B 5/00* (2006.01)
*H01H 9/00* (2006.01)

(52) U.S. Cl.
CPC ........ *B66B 5/0093* (2013.01); *G01R 31/3277* (2013.01); *H01H 9/00* (2013.01)

(58) Field of Classification Search
CPC ....... B66B 5/00; B66B 5/0093; B66B 5/0031; B66B 5/0018; B66B 5/02; G01R 31/327; G01R 31/3277; G01R 31/28; G01R 31/2829; G01R 31/00; H01H 9/00
See application file for complete search history.

(56) References Cited

U.S. PATENT DOCUMENTS

| | | | |
|---|---|---|---|
| 4,002,973 A | 1/1977 | Wiesendanger et al. | |
| 5,107,964 A * | 4/1992 | Coste | B66B 13/24 |
| | | | 187/280 |
| 5,487,448 A | 1/1996 | Schollkopf et al. | |
| 6,467,585 B1 | 10/2002 | Gozzo et al. | |
| 9,371,210 B2 | 6/2016 | Parillo et al. | |
| 10,364,127 B2 | 7/2019 | Muller et al. | |
| 2011/0190773 A1 | 8/2011 | Michelson | |
| 2011/0303492 A1 | 12/2011 | Sonnenmoser et al. | |

(Continued)

FOREIGN PATENT DOCUMENTS

| | | |
|---|---|---|
| CN | 201842552 U | 5/2011 |
| CN | 104555641 A | 4/2015 |

(Continued)

OTHER PUBLICATIONS

European Search Report for Application No. 19211342.1; dated Jun. 8, 2020; 6 Pages.

*Primary Examiner* — Son T Le
(74) *Attorney, Agent, or Firm* — Cantor Colburn LLP

(57) ABSTRACT

An electronic test node (1) for a safety chain (22) in a passenger conveyor system includes an electrical connection (2) for an associated safety switch (4). A processor (6) is configured to monitor a signal carried by the electrical connection (2) so as to detect whether the associated safety switch (4) is open or closed. The electronic test node (1) further includes a test switch (8) connected in series with the electrical connection (2), wherein the processor (6) is configured to run a test by selectively opening the test switch (8) and monitoring for a change in the signal carried by the electrical connection (2).

13 Claims, 3 Drawing Sheets

(56) References Cited

U.S. PATENT DOCUMENTS

2017/0261541 A1* 9/2017 Herkel .................. G01R 31/52
2017/0341906 A1* 11/2017 Muller ................. B66B 5/0031
2018/0079622 A1   3/2018 Sirigu et al.

FOREIGN PATENT DOCUMENTS

| EP | 2125591 A1 | 12/2009 |
| EP | 2336070 A1 | 6/2011 |
| EP | 2349899 B1 | 4/2014 |
| EP | 2789563 A1 | 10/2014 |
| EP | 2930134 A1 | 10/2015 |
| EP | 3388851 A1 | 10/2018 |
| WO | 2018234007 A1 | 12/2018 |

* cited by examiner

ELECTRONIC TEST NODES FOR AUTOMATIC CHECK OF A SAFETY CHAIN

FOREIGN PRIORITY

This application claims priority to European Patent Application No. 19211342.1, filed Nov. 25, 2019, and all the benefits accruing therefrom under 35 U.S.C. § 119, the contents of which in its entirety are herein incorporated by reference.

TECHNICAL FIELD

This disclosure relates to an electronic test node for a safety chain in a passenger conveyor system, a safety chain comprising a plurality of such electronic test nodes, and an associated safety system in a passenger conveyor system.

BACKGROUND

The safety system of a passenger conveyor system needs to be tested for correct functioning at installation and at regular time periods during its lifetime. Most of the tests are performed by manual intervention of a service person activating different safety devices in different locations of the passenger conveyor system. For example, a service person may need to physically access multiple safety devices at different locations in the hoistway of an elevator system. This is time consuming and a 100% check depends on human interaction.

It would be desirable to provide for an automatic check of the safety devices in a safety chain without requiring manual activation.

SUMMARY

According to a first aspect of this disclosure there is provided an electronic test node for a safety chain in a passenger conveyor system, the electronic test node comprising an electrical connection for an associated safety switch and a processor configured to monitor a signal carried by the electrical connection so as to detect whether the associated safety switch is open or closed, wherein the electronic test node further comprises a test switch connected in series with the electrical connection, and wherein the processor is configured to run a test by selectively opening the test switch and monitoring for a change in the signal carried by the electrical connection.

An electronic test node as disclosed herein includes its own dedicated test switch so that the processor is able to open the test switch to simulate opening of the safety switch and thereby test for any faults arising at the node. As will be explained further below, the test switch may be used to detect faults in the processor of the node itself and/or in the external safety switch. An advantage of the processor running a test is that a service person does not need to manually activate the associated safety switch to test the safety chain. Testing can be automated and initiated remotely.

The processor diagnoses a fault by monitoring for a change in the signal carried by the electrical connection. Preferably the electrical connection is bi-directional. This signal may simply be an electrical current carried by the electrical connection to/from the safety switch. Normally, the processor monitors when the signal is interrupted so as to detect when the associated safety switch is open, i.e. the flow of current through the safety switch ceases. When the processor runs a test, the test switch is opened to simulate opening of the safety switch.

In one or more examples, the electrical connection comprises an input to the safety switch and an output from the safety switch. In a first set of examples, the test switch is connected in series with the output. Thus opening the test switch interrupts the electrical connection from the safety switch and this can be used to detect a fault in the processor (including its logic). In a second set of examples, the test switch is connected in series with the input. Thus opening the test switch interrupts the electrical connection to the safety switch and this can be used to detect a fault in the electrical connection or safety switch itself. In all cases, opening the test switch acts to simulate an open safety switch. Of course, in some examples, the electronic test node may comprise a first test switch connected in series with the output and a second test switch connected in series with the input. Furthermore, more than one test switch may be employed in a given position e.g. for redundancy purposes.

The electronic test node is advantageously an entity that is independent of the safety switch. The electronic test node is separate from the safety switch rather than being integrated with the safety switch. The safety switch may optionally have its own integrated test function. In at least some examples, the electronic test node comprises a printed circuit board and the processor is mounted on the printed circuit board, wherein the electrical connection for an associated safety switch is external to the printed circuit board. It will be appreciated that the electronic test node is physically separate from the associated safety switch. This means that either of the electronic test node or safety switch can be removed/replaced without affecting the other one. Furthermore, such an electronic test node can be retrofitted in a safety chain by adding an electrical connection to an existing safety switch. In various examples, the electronic test node can be connected to an associated safety switch by a wired electrical connection or by a wireless connection (e.g. Bluetooth).

The decision to run a test may come from the processor itself, as a result of pre-programming or local instruction e.g. by a service person at the node. For example, the processor may be programmed to automatically run a test at a particular time or with a particular frequency. In at least some examples, the processor is configured to generate a test signal to selectively open the test switch. The processor therefore makes its own decision about when to generate a test signal.

In addition, or alternatively, the decision to run a test may come from the safety chain, e.g. from a controller communicating with the safety chain. The controller may be part of, or in communication with, an elevator control panel. Thus a service person may initiate a test by inputting an instruction at the elevator control panel rather than entering the hoistway to access the node. In at least some examples, the processor is configured to connect to a communication bus so as to receive a test signal instructing the processor to selectively open the test switch. The processor therefore responds to an instruction to run a test. The test signal may be generated automatically or manually.

In various examples, in addition or alternatively, the test signal is preset. It is beneficial if a single preset test signal is used by the electronic test node as this means different nodes can potentially be addressed in the same way, thereby reducing complexity in the safety chain.

In various examples, in addition or alternatively, the test signal is generated depending on the associated safety switch. This enables the test signal to be tailored to the safety switch associated with a given electronic test node. For example, a safety switch with a discrete output signal may need a different test signal pattern than a safety switch with an analogue output signal.

The test signal is used to selectively open the test switch. This is intended to simulate an open safety switch, but ideally the processor is able to distinguish between testing and actual opening of the safety switch. This may be achieved by applying a test signal having a known temporal pattern, so that the processor can monitor for a change in the signal having the same pattern. In various examples, in addition or alternatively, the test signal comprises a test pattern signal. For example, the test pattern signal may vary at certain points in time. The test pattern signal may be regular, irregular or varying in any way, but pre-determined. Thus, in at least some examples, the test pattern signal comprises a pre-determined temporal pattern. In some examples, the test pattern signal may comprise a series of regular pulses. This can result in the test switch being turned on and off repeatedly according to the test pattern. In at least some examples, in addition or alternatively, the pre-determined temporal pattern may vary in time. A variation in the test pattern over time may usefully implement a measure against manipulation from outside (i.e. cybersecurity).

Even if the test signal does not comprise a test pattern, the processor may still be able to distinguish between testing and actual opening of the safety switch depending on the temporal extent of a change in the signal being monitored. If the safety switch were to open spontaneously then there would be a persistent signal change. In at least some examples, in addition or alternatively, the test signal has a limited temporal extent. For example, the test signal may only last for a few milliseconds. This means that the test signal can open and close the test switch more quickly than the safety switch would open and close, to help differentiate between the two events.

It is the processor at the electronic test node that monitors for a change in the signal resulting from a test. The test result may be stored locally, e.g. in a memory connected to the processor. Test result data may then be passed to a safety system as required. However, when the electronic test node is connected to a safety chain it would be more usual for test result data to be shared via the safety chain. Thus, in at least some examples, the processor is configured to connect to a communication bus so as to send a test result signal indicating whether the electronic node is faulty or not. The communication bus may connect multiple electronic test nodes to form a safety chain. In addition, it would be usual for the safety chain to assess whether the safety switch associated with each of the electronic test nodes is open or closed. Thus, in at least some examples, in addition or alternatively, the processor is configured to connect to a communication bus so as to send a status signal indicating whether the associated safety switch is open or closed.

Some further examples of the present disclosure relate to a safety chain in a passenger conveyor system, the safety chain comprising a plurality of electronic test nodes as disclosed herein and at least one communication bus connected to the plurality of electronic test nodes to form the safety chain, wherein each of the electronic test nodes is electrically connected with an associated safety switch.

The electronic test nodes disclosed herein may find use in connection with any type of associated safety switch, for example, a proximity sensor, optical sensor, capacitive sensor, magnetic sensor or Hall Effect sensor. The safety switch may implement radar or lidar techniques. In at least some examples, the associated safety switch is an electromechanical switch. This may simplify the electrical connection between the electronic test node and the safety switch, as a simple current flow can be interrupted by opening of the electromechanical switch.

Some further examples of the present disclosure relate to a safety system in a passenger conveyor system, the safety system comprising a safety chain as disclosed herein and a controller monitoring the safety chain. In various examples, the controller may be configured to generate a test signal that is communicated by the safety chain to the plurality of electronic test nodes, causing a test to be run at one or more of the electronic test nodes, as described above. This test signal may be generated automatically by the controller, for example following a preset testing programme, or manually initiated (e.g. by a service person). Testing can be performed remotely e.g. by a service person or service centre connected to the controller, for example using a cloud connection.

BRIEF DESCRIPTION OF THE DRAWINGS

Certain preferred examples of this disclosure will now be described, by way of example only, and with reference to the accompanying drawings, in which.

DETAILED DESCRIPTION

Figure 1A:
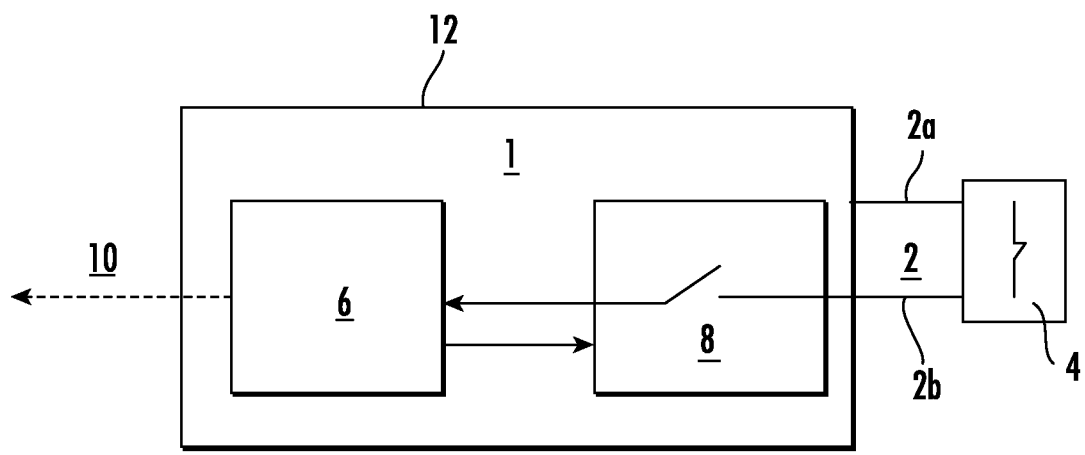
FIG. 1a is a schematic illustration of an electronic test node according to a first example of the present disclosure.
Figure 1B:
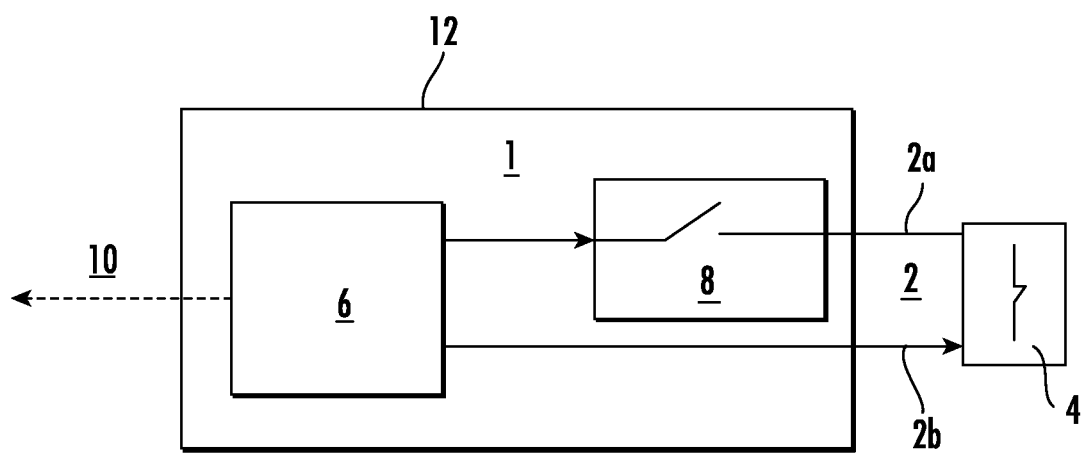
FIG. 1b is a schematic illustration of an electronic test node according to a second example of the present disclosure.

According to examples of the present disclosure seen in FIGS. 1a and 1b, an electronic test node 1 comprises an electrical connection 2 for an associated safety switch 4. The electrical connection 2 provides for bi-directional communication between the electronic test node 1 and the safety switch 4. The electrical connection 2 is illustrated in the form of an input 2a and an output 2b, but of course it is possible for both input and output signals to be carried by a single communication line (e.g. using multiplexing). The electrical connection 2 is illustrated as a physical wired connection but could also be wireless. The electrical connection 2 may simply carry a current to and from the safety switch 4.

The safety switch 4 can be any switch, contact or sensor that is operated to adopt at least two distinct states. In the context of a safety chain in an elevator system, the safety switch 4 may be activated by certain operations of the elevator system. For example, the safety switch 4 may be a door contact that is activated by the opening of a relevant door to switch between closed and open states. When the safety switch 4 is open, for example because there is an open door, then the safety chain is not complete and a controller in the elevator system knows to halt further operation. One way of testing such a safety switch 4 is to manually open the relevant door and check for a change in the safety chain. However, the examples disclosed herein allow the safety chain to be tested without manual intervention.

For testing purposes, the electronic test node 1 includes a processor 6 configured to monitor a signal carried by the electrical connection 2 so as to detect whether the associated safety switch 4 is open or closed. In addition to the processor 6, the electronic test node 1 further comprises a test switch 8 (such as a transistor) connected in series with the electrical connection 2. The processor 6 is configured to run a test by selectively opening the test switch 8 and monitoring for a change in the signal carried by the electrical connection 2. The processor 6 has a connection 10 to a safety chain. This is explained in more detail below.

As seen in FIGS. 1a and 1b, the electronic test node 10 comprises a printed circuit board (PCB) 12 which carries the processor 6, test switch 8 and associated connections. The electrical connection 2 for the safety switch 4 extends external to the PCB 12. The connection 10 may be provided on the PCB 12 or separately connected to the processor 6. The PCB 12 means that the electronic test node 10 is a standalone test component that is independent of the safety switch 4. Either of the electronic test node 10 or safety switch 4 can be removed/replaced without affecting the other one. Furthermore, such an electronic test node 10 can be retrofitted in a safety chain by adding an electrical connection 2 to an existing safety switch 4.

In a first set of examples, illustrated by FIG. 1a, the test switch 8 is configured to interrupt a signal carried by the electrical connection 2 from the safety switch 4. In this example, the test switch 8 is connected in series with the output 2b of the electrical connection 2, thereby interrupting an output signal from the safety switch 4 when the test switch 8 is open. Thus, opening the test switch 8 simulates the safety switch 4 being open and the processor 6 should provide a signal to the safety chain via connection 10 that indicates the safety switch 4 being open. If such a signal is not received (e.g. by an elevator controller monitoring the safety chain) then a fault in the processor 6 (or its logic) can be diagnosed.

In a second set of examples, illustrated by FIG. 1b, the test switch 8 is configured to interrupt a signal carried by the electrical connection 2 to the safety switch 4. In this example, the test switch 8 is connected in series with the input 2a of the electrical connection 2, thereby interrupting an input signal to the safety switch 4 when the test switch 8 is open. Thus, opening the test switch 8 should also simulate the safety switch 4 being open and the processor 6 is expecting a signal that indicates the safety switch 4 being open. If such a signal is not received then a fault in the safety switch 4 and/or its electrical connection 2 can be diagnosed.

Figure 2:
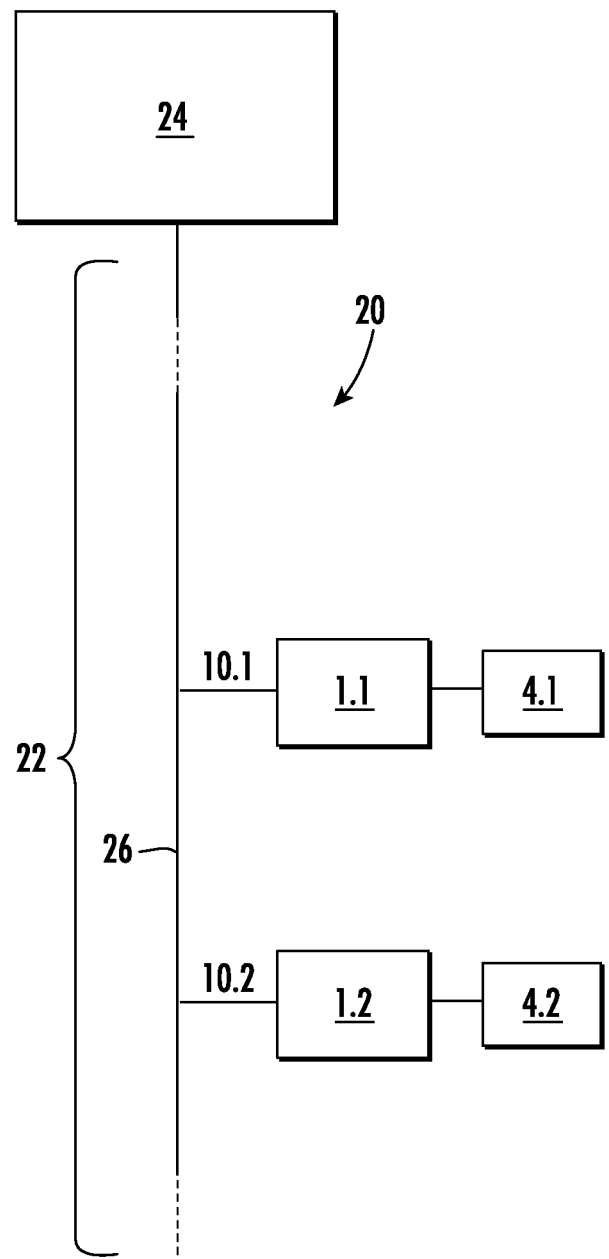
FIG. 2 is a schematic overview of a safety system in an elevator system.

FIG. 2 provides an overview of a safety system 20 in a passenger conveyor system, in this example an elevator system. The safety system 20 comprises a safety chain 22 and a controller 24 monitoring the safety chain 22. In the safety chain 22 there is a plurality of electronic test nodes 1.1, 1.2, etc. and a communication bus 26 connected to the plurality of electronic test nodes 1.1, 1.2, etc. to form the safety chain 22. Each of the electronic test nodes 1.1, 1.2, etc. is electrically connected with an associated safety switch 4.1, 4.2, etc. by an electrical connection 10.1, 10.2, etc. as already described above.

Figure 3:
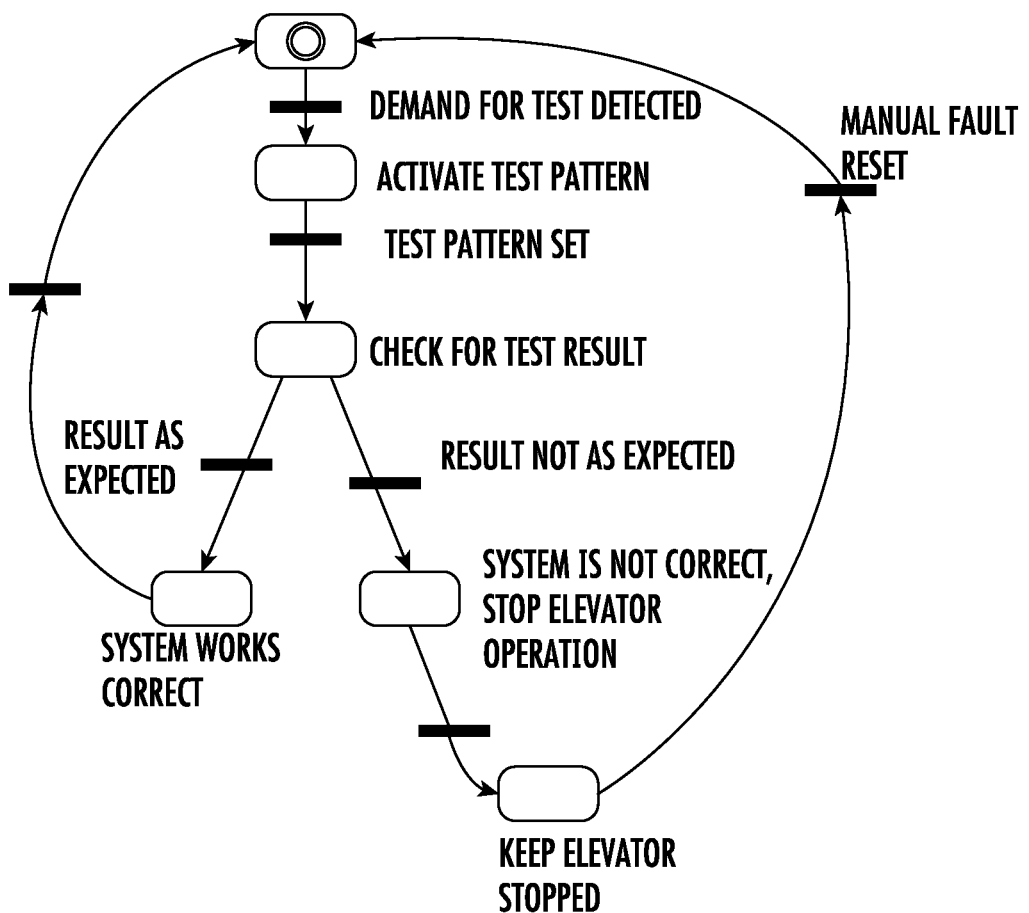
FIG. 3 is a flow diagram for an exemplary test sequence.

FIG. 3 illustrates an exemplary test sequence carried out by the controller 24 monitoring the safety chain 22. The demand for a safety test may be entered manually on an ad hoc basis, for example by a maintenance person (remotely or on site). Or the demand for a safety test may be programmed to occur automatically, for example once a day. The demand for a safety test can be initiated via a cloud maintenance service. An automatic test of the safety system 20 can be set either for a set of defined safety functions or for all safety functions, meaning that a subset of the electronic test nodes 1.n may be selected to receive a test signal when it is desired to test a subset of safety functions. This may be useful during failure analysis of the safety chain 22 and its associated safety switches 4.n.

When the demand for a safety test is detected by the controller 24, a test signal pattern is activated and sent down the safety chain 22 to the electronic test nodes 1.n. In each electronic test node 1.n, the processor 6 receives the test signal pattern and uses this to run a test by selectively opening the test switch 8 and monitoring for a change in the signal carried by the electrical connection 2. The processor 6 then sends a test result signal via the connection 10.n to the controller 24. If the test result is as expected then the controller 24 considers the safety system to be working correctly. If the test result is not as expected then the controller 24 stops elevator operation and waits for a manual fault reset. An alert or fault report may be issued. After a manual fault reset has taken place, the controller 24 typically checks the safety chain 22 again before re-starting operation.

Although FIG. 3 shows a test signal pattern being activated centrally and sent to the electronic test nodes in a safety chain, in other examples the demand for a safety test may take the form of a safety test demand signal that is sent to the electronic test nodes in a safety chain and then the processor in each electronic test node may activate a test signal pattern upon receiving the safety test demand signal. An advantage of the processor at each electronic test node generating its own test signal pattern, in response to a safety test demand signal or otherwise (e.g. locally programmed), is that the test signal pattern may be unique to the associated safety switch. For example, a safety switch with a discrete output signal (e.g. an electromechanical switch) may need a different test signal pattern than a safety switch with an analogue output signal (e.g. an optical sensor).

The Applicant has appreciated, with reference to FIGS. 1a and 1b, that the logic running in the processor 6 of each electronic test node 1 should ideally be able to distinguish between a signal resulting from the associated safety switch 4 being open itself, and a simulated signal resulting from opening of the test switch 8. If a safety switch 4 were to open at the same time as running a test then the processor 6 should be able to recognise this so that the true status of the safety chain is always known.

Figure 4:
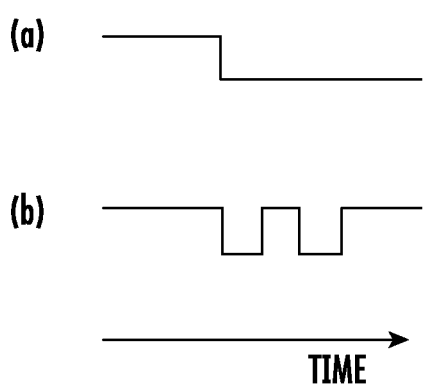
FIG. 4 schematically illustrates (a) a safety test demand signal and (b) a test pattern signal.

FIG. 4 illustrates at (a) a safety test demand signal arising when a safety switch adopts an open state. There is a one-off change in time of the signal being monitored. FIG. 4 illustrates at (b) a test pattern signal arising when a processor is configured to run a test by selectively opening and closing a test switch at set times according to the test pattern. The test pattern comprises a pre-determined temporal pattern, in this example shown (for simplicity) as a series of regular pulses. Typically the test switch is only opened for a relatively short period of time, e.g. 5-10 ms. If the associated safety switch were to adopt an open state then it would soon become apparent from the continuous change in the signal being monitored.

It will be appreciated by those skilled in the art that the disclosure has been illustrated by describing one or more specific examples thereof, but is not limited to these aspects; many variations and modifications are possible, within the scope of the accompanying claims.

What is claimed is:

1. An electronic test node (1) for a safety chain (22) in a passenger conveyor system, the electronic test node (1) comprising:
   an electrical connection (2) for an associated safety switch (4); and a processor (6) configured to monitor a signal carried by the electrical connection (2) so as to detect whether the associated safety switch (4) is open or closed;

characterised in that the electronic test node (1) further comprises a test switch (8) connected in series with the electrical connection (2), wherein the processor (6) is configured to run a test by selectively opening the test switch (8) and monitoring for a change in the signal carried by the electrical connection (2);

wherein the electronic test node (1) comprises a printed circuit board (12) and the processor (6) and test switch (8) are mounted on the printed circuit board (12), and wherein the electrical connection (2) for an associated safety switch (4) is external to the printed circuit board (12).

2. The electronic test node (1) of claim 1, wherein the electrical connection (2) comprises an input (2a) to the safety switch (4) and an output (2b) from the safety switch (4), the test switch (8) connected in series with the output (2b).

3. The electronic test node (1) of claim 1, wherein the electrical connection (2) comprises an input (2a) to the safety switch (4) and an output (2b) from the safety switch (4), the test switch (8) connected in series with the input (2a).

4. The electronic test node (1) of claim 1, wherein the processor (6) is configured to generate a test signal to selectively open the test switch (8).

5. The electronic test node (1) of claim 1, wherein the processor (6) is configured to connect to a communication bus (26) so as to receive a test signal instructing the processor (6) to selectively open the test switch (8).

6. The electronic test node (1) of claim 1, wherein the test signal comprises a test pattern signal.

7. The electronic test node (1) of claim 6, wherein the test pattern signal comprises a pre-determined temporal pattern.

8. The electronic test node (1) of claim 1, wherein the processor (6) is configured to connect to a communication bus (26) so as to send a test result signal indicating whether the electronic test node (1) is faulty or not.

9. A safety chain in a passenger conveyor system, comprising a plurality of electronic test nodes (1.n) according to claim 1 and at least one communication bus (26) connected to the plurality of electronic test nodes (1.n) to form the safety chain (22), wherein each of the electronic test nodes (1.n) is electrically connected with an associated safety switch (4.n).

10. The safety chain of claim 9, wherein the associated safety switch (4.n) is an electromechanical switch.

11. A safety system in a passenger conveyor system, comprising a safety chain (22) according to claim 9 and a controller (24) monitoring the safety chain.

12. The safety system of claim 11, wherein the controller (24) is configured to generate a test signal that is communicated by the safety chain (22) to the plurality of electronic test nodes (1.n).

13. An electronic test node (1) for a safety chain (22) in a passenger conveyor system, the electronic test node (1) comprising:

an electrical connection (2) for an associated safety switch (4); and a processor (6) configured to monitor a signal carried by the electrical connection (2) so as to detect whether the associated safety switch (4) is open or closed;

wherein the electronic test node (1) further comprises a test switch (8) connected in series with the electrical connection (2), wherein the processor (6) is configured to run a test by selectively opening the test switch (8) and monitoring for a change in the signal carried by the electrical connection (2);

wherein the safety chain is not interrupted by the test switch being in an open state and the safety chain is not interrupted by the test switch being in a closed state.

* * * * *